(12) United States Patent
Jiang et al.

(10) Patent No.: US 10,459,279 B2
(45) Date of Patent: Oct. 29, 2019

(54) ARRAY SUBSTRATE, METHOD FOR MANUFACTURING THE SAME, DISPLAY PANEL AND DISPLAY DEVICE

(71) Applicants: BOE TECHNOLOGY GROUP CO., LTD., Beijing (CN); Hefei Xinsheng Optoelectronics Technology Co., Ltd., Heife, Anhui (CN)

(72) Inventors: Liangliang Jiang, Beijing (CN); Zhou Rui, Beijing (CN); Lei Guo, Beijing (CN)

(73) Assignees: BOE TECHNOLOGY GROUP CO., LTD., Beijing (CN); HEFEI XINSHENG OPTOELECTRONICS TECHNOLOGY CO., LTD., Heife, Anhui (CN)

( * ) Notice: Subject to any disclaimer, the term of this patent is extended or adjusted under 35 U.S.C. 154(b) by 0 days.

(21) Appl. No.: 15/097,079

(22) Filed: Apr. 12, 2016

(65) Prior Publication Data
US 2017/0090244 A1   Mar. 30, 2017

(30) Foreign Application Priority Data

Sep. 25, 2015   (CN) .......................... 201510624625

(51) Int. Cl.
*G02F 1/1335*   (2006.01)
*G02B 5/20*   (2006.01)
(Continued)

(52) U.S. Cl.
CPC ....... *G02F 1/133516* (2013.01); *G02B 5/207* (2013.01); *G02F 1/133514* (2013.01);
(Continued)

(58) Field of Classification Search
None
See application file for complete search history.

(56) References Cited

U.S. PATENT DOCUMENTS 6,833,897 B2 * 12/2004 Lee ................... G02F 1/134363
349/141
7,414,682 B2 * 8/2008 Shiota ............... G02F 1/133512
349/114
(Continued)

FOREIGN PATENT DOCUMENTS

CN   101598876 A   12/2009
CN   102544028   7/2012
(Continued)

OTHER PUBLICATIONS

"Third office action," CN Application No. 201510624625.X dated Apr. 23, 2018.
(Continued)

*Primary Examiner* — Telly D Green
(74) *Attorney, Agent, or Firm* — Womble Bond Dickinson (US) LLP

(57) ABSTRACT

An array substrate, a method for manufacturing the same, a display panel and a display device are disclosed, for reducing the amount of harmful blue light in a backlight without influencing the display quality of the product. The array substrate comprises a light-transmission region and a non-transmission region, and the light-transmission region is provided with a blue light filtering layer configured to absorb blue light with a wavelength smaller than 450 nm (FIG. 1).

4 Claims, 5 Drawing Sheets

(51) Int. Cl.
*G02F 1/1362* (2006.01)
*H01L 21/027* (2006.01)
*H01L 21/3213* (2006.01)
*H01L 27/12* (2006.01)
*H01L 29/786* (2006.01)

(52) U.S. Cl.
CPC .... *G02F 1/136209* (2013.01); *H01L 21/0274* (2013.01); *H01L 21/32133* (2013.01); *H01L 27/1248* (2013.01); *H01L 27/1259* (2013.01); *H01L 29/78633* (2013.01); *G02F 2001/133565* (2013.01); *G02F 2001/136222* (2013.01); *G02F 2203/055* (2013.01)

(56) References Cited

U.S. PATENT DOCUMENTS

| | | | | |
|---|---|---|---|---|
| 7,583,347 | B2* | 9/2009 | Shiota | G02F 1/133512 349/114 |
| 8,033,706 | B1* | 10/2011 | Kelly | G02B 6/0036 362/307 |
| 8,319,928 | B2* | 11/2012 | Nagano | G02F 1/134363 349/141 |
| 9,395,582 | B2* | 7/2016 | Chen | G03F 1/26 |
| 2001/0030728 | A1* | 10/2001 | Takasugi | G02F 1/1345 349/149 |
| 2004/0027524 | A1* | 2/2004 | Shiota | G02F 1/133512 349/129 |
| 2004/0130253 | A1 | 7/2004 | Ohsaki et al. | |
| 2007/0040979 | A1* | 2/2007 | Shiota | G02F 1/133512 349/141 |
| 2012/0168746 | A1 | 7/2012 | Yim et al. | |
| 2013/0128548 | A1* | 5/2013 | Lin | G02F 1/133514 362/97.1 |
| 2014/0204319 | A1* | 7/2014 | Cai | G02F 1/133514 349/106 |
| 2015/0293280 | A1* | 10/2015 | Lee | G02B 5/201 359/891 |
| 2016/0306220 | A1* | 10/2016 | Zhang | G02F 1/133345 |
| 2017/0018239 | A1* | 1/2017 | Chen | G09G 3/3607 |
| 2017/0108722 | A1* | 4/2017 | Gao | G02F 1/1368 |
| 2017/0139267 | A1 | 5/2017 | Sun et al. | |
| 2017/0254934 | A1* | 9/2017 | Liang | G03F 7/26 |

FOREIGN PATENT DOCUMENTS

| | | |
|---|---|---|
| CN | 103646958 A | 3/2014 |
| CN | 103676702 A | 3/2014 |
| CN | 203673091 U | 6/2014 |
| CN | 203693162 U | 7/2014 |
| CN | 104779256 A | 7/2015 |
| CN | 104793396 A | 7/2015 |
| JP | 2004252418 A | 9/2004 |

OTHER PUBLICATIONS

"Second office action," CN Application No. 201510624625.X (dated Dec. 11, 2017).

Office Action in Chinese Application No. 201510624625.X dated Jul. 28, 2017, with English translation.

* cited by examiner

ARRAY SUBSTRATE, METHOD FOR MANUFACTURING THE SAME, DISPLAY PANEL AND DISPLAY DEVICE

RELATED APPLICATIONS

The present application claims the benefit of Chinese Patent Application No. 201510624625.X, filed Sep. 25, 2015, the entire disclosure of which is incorporated herein by reference.

FIELD OF THE INVENTION

The present invention relates to the field of display technologies, and in particular to an array substrate, a method for manufacturing the same, a display panel and a display device.

BACKGROUND ART

As compared with a cathode ray tube (CRT) display, a liquid crystal display (LCD) has many advantages such as a small thickness and a low power consumption. Therefore, the liquid crystal display has replaced the CRT display in various fields. As a passive light-emitting display, the liquid crystal display requires a thin backlight with uniform luminance and high energy efficiency. A white light emitting diode (LED) backlight, owing to its prominent merits, is gradually substituting for the cold cathode fluorescent lamp (CCFL) techniques and becoming the mainstream backlight for the existing liquid crystal displays.

However, as for a backlight in an existing liquid crystal display device, the spectrum comprises a large amount of high-energy and short-wave blue light at irregular frequencies with a wavelength smaller than 450 nm. The short-wave blue light has extremely high energy and can penetrate through the lens and impinge on the retina directly. When the blue light irradiates the retina, free radicals are generated to cause contabescence of the retinal pigment epithelial cells, which may result in nutrient inadequacy of the photosensitive cells and thus lead to impairment of vision.

White light does not exist on its own in the nature. Blue light is an important component of the visible light spectrum, and is mixed with green light and red light to present white light. At present, according to a conventional process for a white light LED, phosphorous powder is added into a blue chip. The blue light is used as an excitation light, and the shorter the wavelength is, the stronger excitation capacity it has; and after the blue light excites the phosphorous powder coated on the surface of the chip, light of a corresponding color is emitted, and then interacts with the blue light to provide a synthesized white light by color mixture. Among the spectrum of a conventional white light LED backlight, blue light with a wavelength between 430 nm and 450 nm is the most harmful to human eyes.

In order to improve the blue light radiation and reduce its harm to the human eyes, anti-blue light radiation lens are designed in the prior art. These types of lens can reach a filtering effect of 40% to 50% with respect to blue light with a wavelength at 400 nm-500 nm. Although these types of lens can reduce the amount of harmful blue light in the backlight to a certain degree and thereby protect eyes of the user, such design has the following disadvantages. (a) The film structure is complicated, which results in difficulties in processing. (b) The blue light is absorbed in a large range, the loss of blue light between 400 nm and 500 nm is considerable, and this will affect the visual effect and the display gamut. (c) Dedicated glasses for filtering the blue light are worn, which are worn by one person only, influencing the visual experience of the human eyes and bringing a poorer viewing effect.

To sum up, when harmful blue light in the backlight is reduced according to the prior art, the manufacture process is difficult, and the range of blue light to be absorbed is large, which influences the display quality of the product.

SUMMARY

Embodiments of the present invention provide an array substrate, a method for manufacturing the same, a display panel, and a display device, for reducing the amount of harmful blue light in a backlight without influencing the display quality of the product.

An array substrate provided in embodiments of the present invention, comprises a light-transmission region and a non-transmission region, wherein the light-transmission region comprises a blue light filtering layer which is configured to absorb blue light with a wavelength smaller than 450 nm.

In the array substrate according to embodiments of the present invention, the blue light filtering layer is only arranged in the light-transmission region of the array substrate, and is configured to absorb blue light with a wavelength smaller than 450 nm. Therefore, as compared with the prior art in which a complicated film structure for the anti-blue light radiation lens is provided, the array substrate in embodiments of the present invention can absorb high-energy and short-wave blue light in a narrower wavelength band. That is, the amount of harmful blue light in the backlight can be reduced without influencing the display quality of the product.

For instance, the blue light filtering layer comprises semiconductor nano particles.

For instance, the semiconductor nano particles are carbon-doped titanium dioxide.

For instance, the semiconductor nano particles are a compound of tungsten oxide and silicon dioxide.

For instance, the array substrate comprises a gate, a gate insulation layer, a semiconductor active layer, a source, a drain, a passivation layer, the blue light filtering layer and a pixel electrode which are located sequentially on a base substrate.

For instance, an orthogonal projection region of the blue light filtering layer on the base substrate is located within an orthogonal projection region of the pixel electrode on the base substrate.

For instance, the array substrate comprises a light shielding layer, a first insulation layer, a semiconductor active layer, a second insulation layer, a gate, a third insulation layer, a source, a drain, a passivation layer, the blue light filtering layer and a pixel electrode which are located sequentially on a base substrate.

For instance, an orthogonal projection region of the blue light filtering layer on the base substrate is located within an orthogonal projection region of the pixel electrode on the base substrate.

A display device is further provided in embodiments of the present invention, the display device comprising the above array substrate.

A display panel is further provided in embodiments of the present invention, the display panel comprising a color filter substrate and the above array substrate which are arranged oppositely.

A method for manufacturing an array substrate is further provided in specific embodiments of the present invention, comprising manufacturing a gate, a semiconductor active layer, a source, a drain and a pixel electrode on a base substrate, wherein the method further comprises: manufacturing a blue light filtering layer in a region corresponding to the pixel electrode, the blue light filtering layer being configured to absorb the blue light with a wavelength smaller than 450 nm.

For instance, the method specifically comprises:

manufacturing a gate, a gate insulation layer, the semiconductor active layer, the source and the drain sequentially on the base substrate by a patterning process;

forming a passivation layer and a blue light filtering film sequentially on the base substrate after completion of the previous step, and forming a via hole that penetrates through the passivation layer and the blue light filtering film by a patterning process to expose the drain to be electrically connected to the pixel electrode to be formed subsequently;

forming a transparent conductive film on the base substrate after completion of the previous step;

coating a photoresist on the transparent conductive film, and exposing and developing the photoresist to retain the photoresist only at a position where the pixel electrode is to be formed;

etching the transparent conductive film and the blue light filtering film and removing the remaining photoresist to form the pixel electrode and the blue light filtering layer, the pixel electrode being electrically connected with the exposed drain through the via hole.

For instance, the method specifically comprises:

manufacturing a light shielding layer, a first insulation layer, the semiconductor active layer, a second insulation layer, the gate, a third insulation layer, the source and the drain sequentially on the base substrate by a patterning process;

forming a passivation layer and a blue light filtering film sequentially on the base substrate after completion of the previous step, and forming a via hole that penetrates through the passivation layer and the blue light filtering film by a patterning process to expose the drain to be electrically connected to the pixel electrode to be formed subsequently;

forming a transparent conductive film on the base substrate after completion of the previous step;

coating a photoresist on the transparent conductive film, and exposing and developing the photoresist to retain the photoresist only at a position where the pixel electrode is to be formed;

etching the transparent conductive film and the blue light filtering film and removing the remaining photoresist to form the pixel electrode and the blue light filtering layer, the pixel electrode being electrically connected with the exposed drain through the via hole.

For instance, forming the blue light filtering film comprises:

forming the blue light filtering film by magnetron sputtering.

DETAILED DESCRIPTION OF EMBODIMENTS

An array substrate, a method for manufacturing the same, a display panel, and a display device are provided in embodiments of the present invention, for reducing the amount of harmful blue light in a backlight without influencing the display quality of the product.

In order to make goals, technical solutions and advantages of the present invention clearer, the present invention shall be further described in details as follows with reference to the drawings. Apparently, the embodiments described here are only a part of embodiments of the present invention, rather than all of them. Based on the embodiments of the present invention, all other embodiments obtained by those having ordinary skills in the art without inventive efforts, shall fall within the protection scope of the present invention.

The array substrate provided in the specific embodiments of the present invention will be introduced in details as follows with reference to the drawings.

Figure 1:
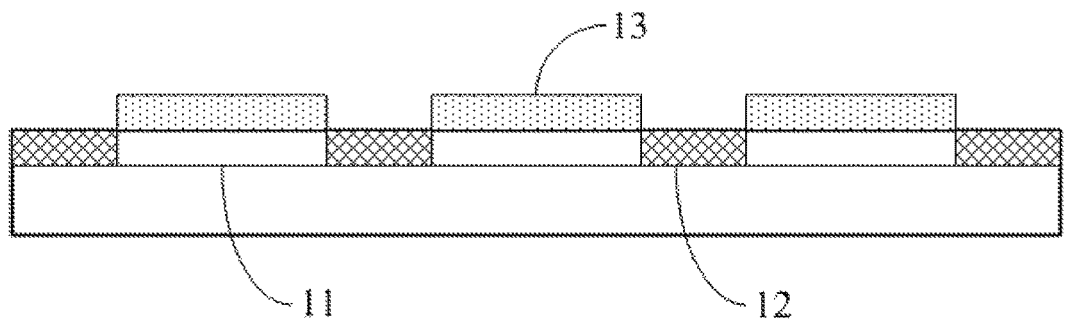
FIG. 1 is a schematic structural view of an array substrate provided in an embodiment of the present invention.

As shown in FIG. 1, specific embodiments of the present invention provide an array substrate comprising a light-transmission region 11 and a non-transmission region 12. In the specific embodiments of the present invention, the light-transmission region 11 of the array substrate is provided with a blue light filtering layer 13 for absorbing blue light with a wavelength smaller than 450 nm.

For instance, the blue light filtering layer 13 in the specific embodiments of the present invention comprises semiconductor nano particles which can absorb light with a particular wavelength due to their energy level structure.

In implementations, the blue light filtering layer 13 in the specific embodiments of the present invention is titanium dioxide ($TiO_2$) doped with carbon (C) powder, or a compound of tungsten oxide ($WO_3$) and silicon dioxide ($SiO_2$).

When the blue light filtering layer 13 in the specific embodiments of the present invention is a compound of $WO_3$ and $SiO_2$, the compound has a band gap width of 2.8 eV (electron volt), making it an ideal semiconductor material for absorbing and filtering the blue light.

When the blue light filtering layer 13 in the specific embodiments of the present invention is $TiO_2$ doped with C powder, it has a transmittance of lower than 30% for a wavelength smaller than 450 nm, and a transmittance of higher than 90% for a wavelength greater than or equal to 500 nm. Besides, $TiO_2$ doped with C powder show great absorption with respect to the blue light with a wavelength smaller than 450 nm.

Figure 2:
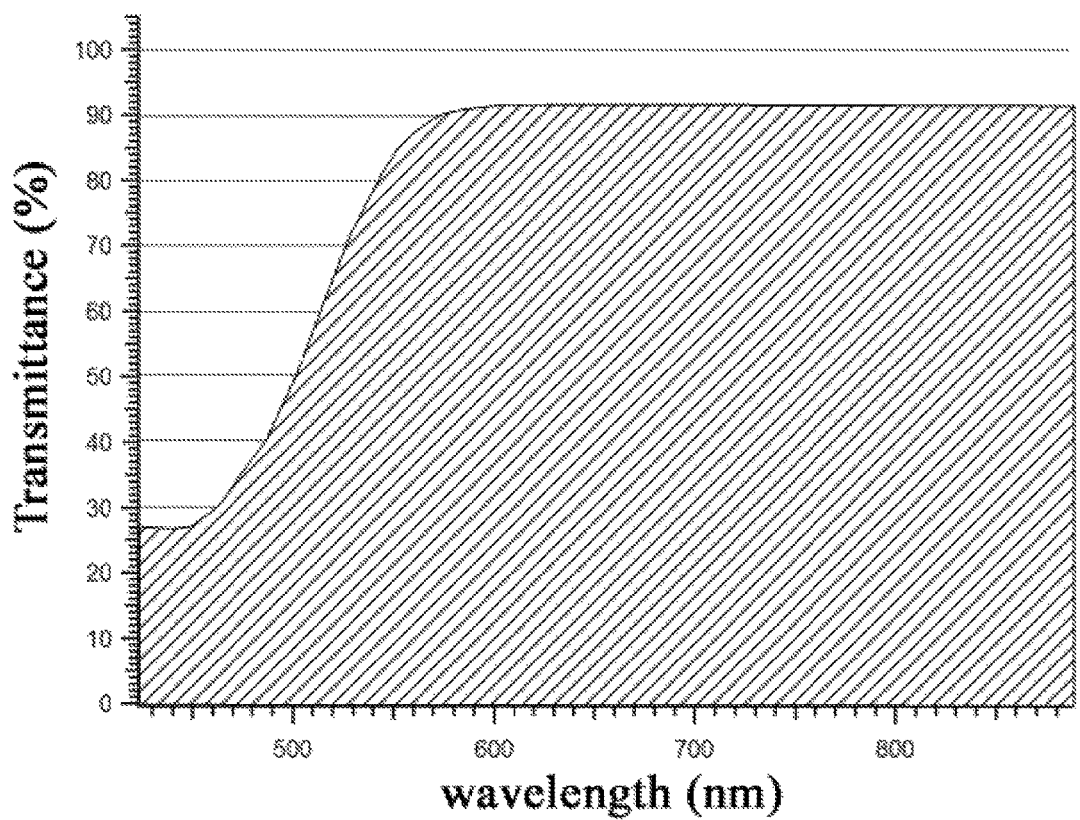
FIG. 2 is a schematic view of the blue light absorption effect of a blue light filtering layer provided in an embodiment of the present invention.

The blue light filtering layer 13 in the specific embodiments of the present invention is introduced by taking $TiO_2$ doped with C powder as an example. $TiO_2$ doped with C powder has an absorptivity of 70% with respect to blue light having a wavelength of smaller than 450 nm, as shown in FIG. 2.

The thin film transistors in the array substrate in the specific embodiments of the present invention can be of a bottom-gate type, a top-gate type, or other types like a side-gate type. The specific position of the blue light filtering layer in the specific embodiments of the present invention on the array substrate is specifically introduced mainly by taking thin film transistors of a bottom-gate type and those of a top-gate type as an example in the specific embodiments of the present invention.

The thickness of films and the size and shape of regions in the drawings are not provided to reflect the real scale of each film, but only for the purpose of schematic illustration of the contents of the invention.

Figure 3:
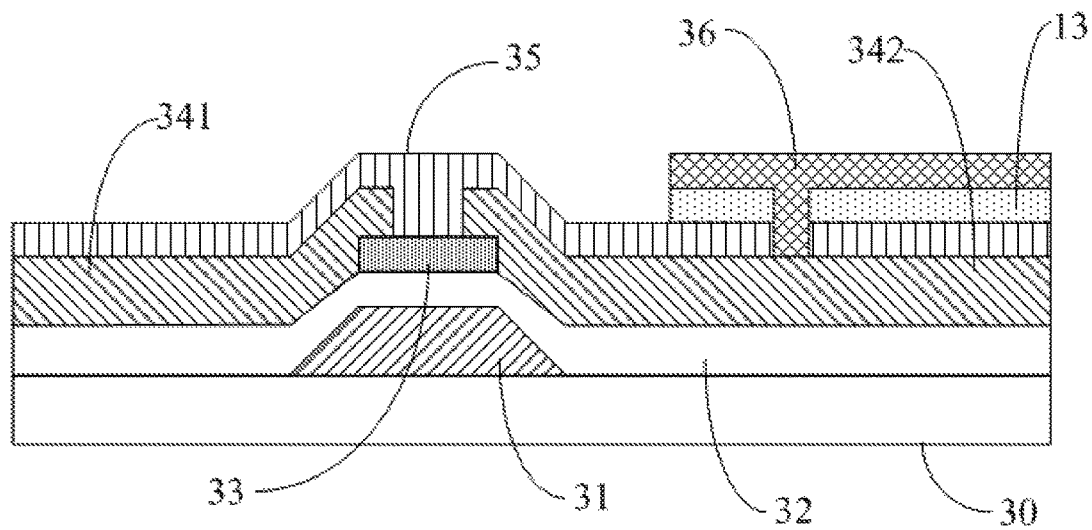
FIG. 3 is a schematic structural view of an array substrate provided in an embodiment of the present invention.

In an exemplary embodiment, the thin film transistors are of a bottom-gate type. As shown in FIG. 3, the array substrate in the specific embodiments of the present invention comprises a gate 31, a gate insulation layer 32, a semiconductor active layer 33, a source 341, a drain 342, a passivation layer 35, a blue light filtering layer 13 and a pixel electrode 36 which are located sequentially on a base substrate 30, wherein an orthogonal projection region of the blue light filtering layer 13 on the base substrate 30 is located within an orthogonal projection region of the pixel electrode 36 on the base substrate 30.

The blue light filtering layer 13 in the specific embodiments of the present invention is introduced by taking C-doped $TiO_2$ as an example. The non-transmission region of the array substrate comprises a thin film transistor switch, a gate line and a data line. If the blue light filtering layer 13 is arranged in the non-transmission region of the array substrate, the normal charging/discharging process of the array substrate will be influenced. The light-transmission region of the array substrate comprises a transparent material with an excellent conductivity, and only controls the power-up of each pixel and the deflection of the liquid crystal. Therefore, the region of the pixel electrode can serve as an ideal region for arranging a blue light filtering layer.

The blue light filtering layer in the specific embodiments of the present invention is located below the pixel electrode 36. In an actual design, the blue light filtering layer 13 can also be located above the pixel electrode. The array substrate in the specific embodiments of the present invention can further comprise a common electrode (not shown) located above or below the pixel electrode 36 and insulated from the pixel electrode 36. The blue light filtering layer 13 in the specific embodiments of the present invention can also be located above or below the common electrode. In an actual design, the blue light filtering layer 13 in the specific embodiments of the present invention can also be arranged on the base substrate 30 directly, or between any two films on the array substrate.

Figure 4:
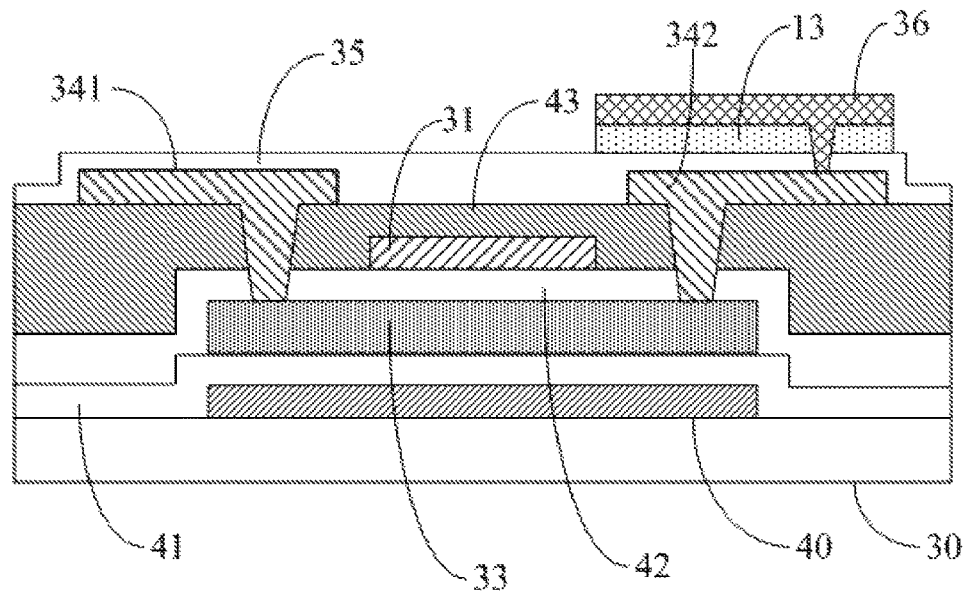
FIG. 4 is a schematic structural view of an array substrate provided in an embodiment of the present invention.

In an exemplary embodiment, the thin film transistors are of a top-gate type. As shown in FIG. 4, the array substrate in the specific embodiments of the present invention comprises a light shielding layer 40, a first insulation layer 41, a semiconductor active layer 33, a second insulation layer 42, a gate 31, a third insulation layer 43, a source 341, a drain 342, a passivation layer 35, a blue light filtering layer 13 and a pixel electrode 36 which are located sequentially on the base substrate 30, wherein the orthogonal projection region of the blue light filtering layer 13 on the base substrate 30 is located within the orthogonal projection region of the pixel electrode 36 on the base substrate 30.

The orthogonal projection region of the blue light filtering layer 13 in the specific embodiments of the present invention on the base substrate 30 is located within the orthogonal projection region of the pixel electrode 36 on the base substrate 30. The blue light filtering layer 13 does not interfere with the normal functions on the array substrate and hence produces little interference with the thin film transistor switch, the gate line and the data line.

The blue light filtering layer 13 in the specific embodiments of the present invention is located below the pixel electrode 36. In an actual design, the blue light filtering layer 13 can also be located above the pixel electrode 36. The array substrate in the specific embodiments of the present invention can further comprise a common electrode (not shown) located above or below the pixel electrode 36 and insulated from the pixel electrode 36. The blue light filtering layer 13 in the specific embodiments of the present invention can also be located above or below the common electrode. In an actual design, the blue light filtering layer 13 in the specific embodiments of the present invention can also be arranged on the base substrate 30 directly, or between any two films on the array substrate.

Figure 5:
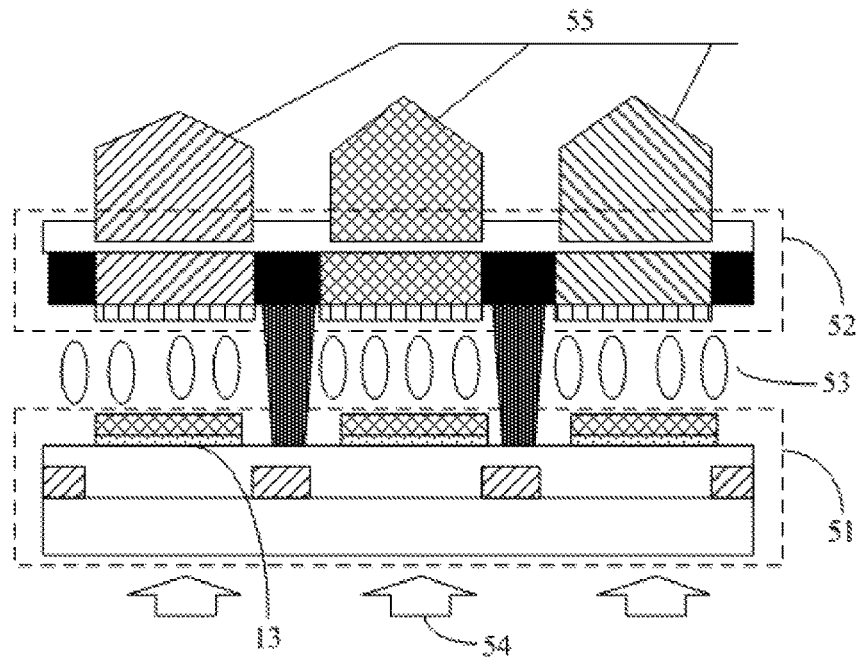
FIG. 5 is a schematic structural view of a display panel provided in an embodiment of the present invention.

In an exemplary embodiment, a display panel is further provided. As shown in FIG. 5, the display panel comprises an array substrate 51 and a color filter substrate 52 arranged oppositely, and a liquid crystal layer 53 located between the array substrate 51 and the color filter substrate 52. The array substrate 51 is the array substrate provided in the above specific embodiments of the present invention. A backlight in the specific embodiments of the present invention emits light 54 comprising blue light with a wavelength smaller than 450 nm. After the light 54 passes through the array substrate 51 and the color filter substrate 52, since the array substrate is provided with the blue light filtering layer 13, the blue light with a wavelength smaller than 450 nm is absorbed, and the blue light with a wavelength smaller than 450 nm is reduced or eliminated in exit light 55, which reduces or avoids injuries to the human eyes by the blue light radiation.

In an exemplary embodiment, a display device is further provided. The display device comprises the above array substrate, and it can be a display device such as a liquid crystal panel, a liquid crystal display, a liquid crystal television, an organic light emitting diode (OLED) panel, an OLED display, and an OLED television or electronic paper.

The specific embodiments of the present invention further provide a method for manufacturing an array substrate, comprising manufacturing a gate, a semiconductor active layer, a source, a drain and a pixel electrode on a base substrate. The method further comprises: manufacturing a blue light filtering layer in a region corresponding to the pixel electrode, the blue light filtering layer being configured to absorb blue light with a wavelength smaller than 450 nm.

The method for manufacturing an array substrate provided in the specific embodiments of the present invention is specifically introduced mainly by taking the manufacture of an array structure with thin film transistors of a bottom-gate type and the manufacture of an array structure with thin film transistors of a top-gate type as an example.

Figure 6:
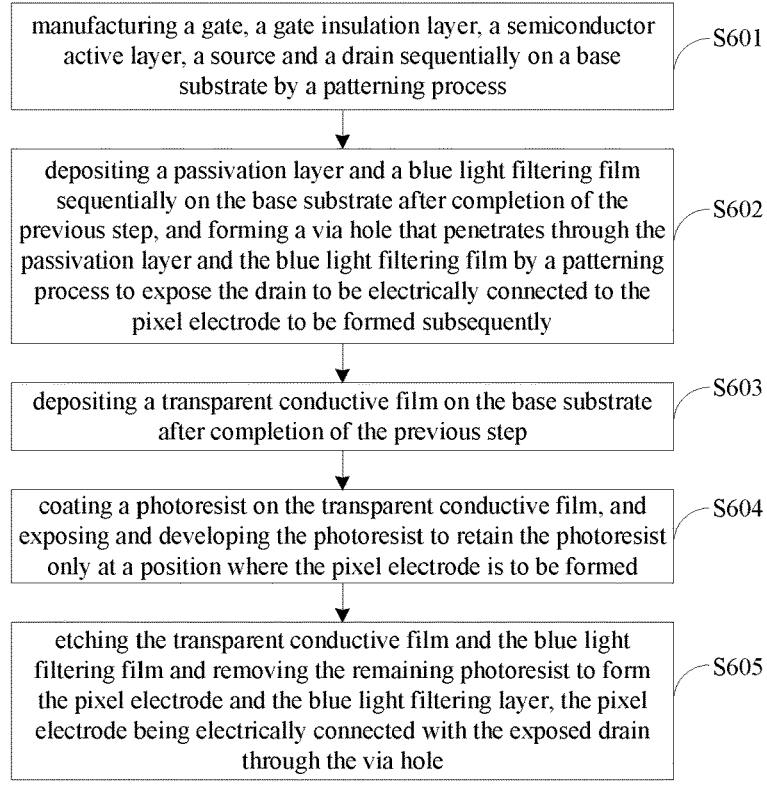
FIG. 6 is a flowchart of a method for manufacturing an array substrate provided in an embodiment of the present invention.

For an array substrate with thin film transistors of a bottom-gate type, specifically as shown in FIG. 6, the method for manufacturing an array substrate provided in the specific embodiments of the present invention comprises the following steps:

S601, manufacturing the gate, the gate insulation layer, the semiconductor active layer, the source and the drain sequentially on the base substrate by a patterning process;

S602, forming a passivation layer and a blue light filtering film sequentially on the base substrate after completion of the previous step, and forming a via hole that penetrates through the passivation layer and the blue light filtering film by a patterning process to expose the drain to be electrically connected to the pixel electrode to be formed subsequently;

S603, forming a transparent conductive film on the base substrate after completion of the previous step;

S604, coating a photoresist on the transparent conductive film, and exposing and developing the photoresist to retain the photoresist only at a position where the pixel electrode is to be formed;

S605, etching the transparent conductive film and the blue light filtering film and removing the remaining photoresist to form the pixel electrode and the blue light filtering layer, the pixel electrode being electrically connected with the exposed drain through the via hole.

The method for manufacturing an array substrate provided in the specific embodiments of the present invention is introduced in details as follows with reference to the drawings.

Figure 7A:
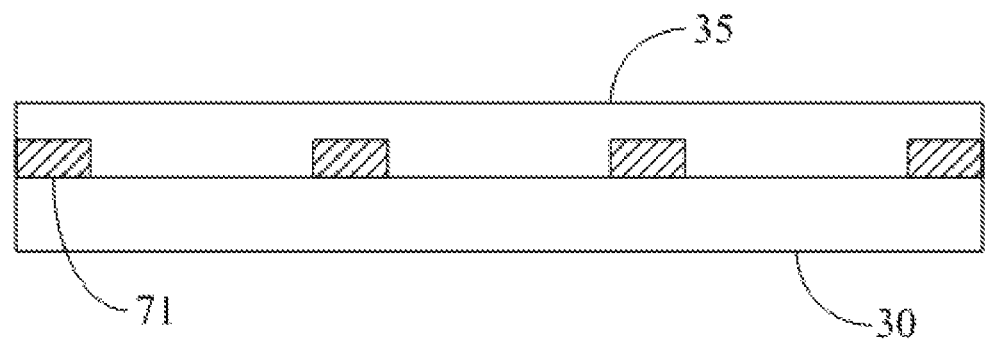
FIGS. 7a, 7b, 7c and 7d are structural views of different phases of a process of manufacturing an array substrate provided in embodiments of the present invention.

As shown in FIG. 7a, in the specific embodiments of the present invention a gate, a gate insulation layer, a semiconductor active layer, a source and a drain are manufactured sequentially on a base substrate 30 by a patterning process. The base substrate 30 in the specific embodiments of the present invention is a glass substrate, and during the actual production, the base substrate 30 can also be a substrate such as a flexible substrate, and the specific materials of the base substrate will not be limited in the specific embodiments of the present invention. The specific method for manufacturing a gate, a gate insulation layer, a semiconductor active layer, a source and a drain on the base substrate 30 by a patterning process in the specific embodiments of the present invention is the same as that in the prior art, which will not be described herein for simplicity. In the drawing, 71 indicates the gate, the source, the drain, the gate line and the data line manufactured in the non-transmission region of the array substrate.

Then, as shown in FIG. 7a, a passivation layer 35 is formed on the base substrate 30 after completion of the previous step. The specific method for forming a passivation layer is the same as that in the prior art, which will not be described herein for simplicity.

Figure 7B:
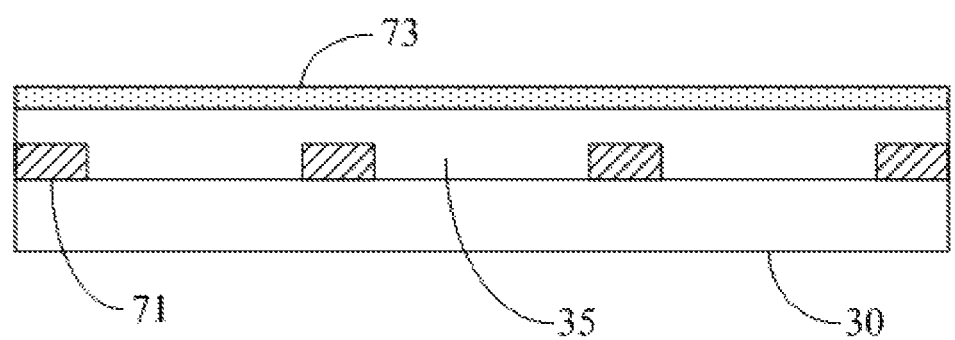

Then, a blue light filtering film 73 is formed on the passivation layer 35 as shown in FIG. 7b. For example, in the specific embodiments of the present invention, the blue light filtering film 73 is formed by magnetron sputtering. Of course, during the actual production, the blue light filtering film 73 can also be formed by other film forming methods. After that, a via hole (not shown) that penetrates through the passivation layer 35 and the blue light filtering film 73 is formed by a patterning process to expose the drain to be electrically connected to the pixel electrode to be formed subsequently. The specific position of the via hole formed in the specific embodiments of the present invention is shown in FIG. 3 as an example. The patterning process in the specific embodiments of the present invention comprises a part or all of the procedure of coating, exposing, developing, etching and removing the photoresist. The specific method for forming a via hole that penetrates through the passivation layer 35 and the blue light filtering film 73 by a patterning process in the specific embodiments of the present invention is similar to that for forming a via hole that penetrates through a passivation layer by a patterning process in the prior art, which will not be described herein for simplicity.

Figure 7C:
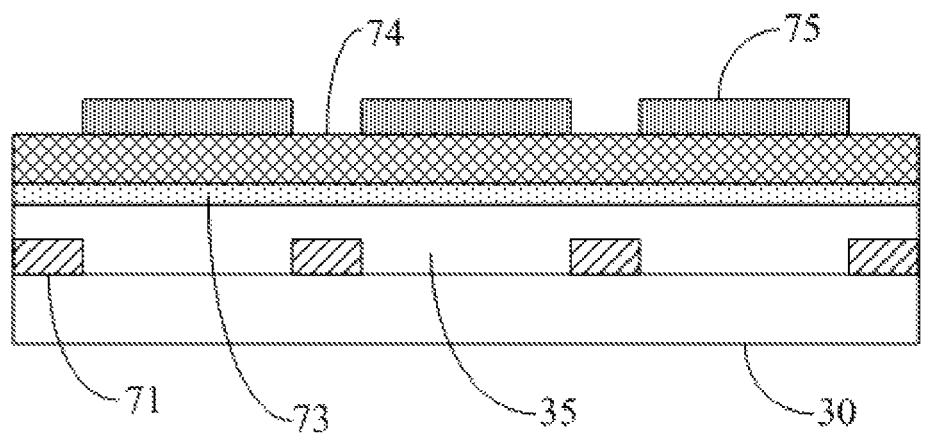

Next, a transparent conductive film 74 is formed on the blue light filtering film 73 as shown in FIG. 7c. The transparent conductive film 74 can also be formed by magnetron sputtering in the specific embodiments of the present invention. The transparent conductive film 74 formed in the specific embodiments of the present invention can be a monolayer of indium tin oxides (ITO), or a monolayer of indium zinc oxides (IZO), or a composite membrane of ITO and IZO. The specific materials of the transparent conductive film 74 and the forming method thereof are not limited in the specific embodiments of the present invention.

As shown in FIG. 7c, a photoresist 75 is then coated on the transparent conductive film 74. The photoresist 75 is exposed and developed to retain the part of the photoresist 75 only at a position where a pixel electrode is to be formed. A mask plate for forming a pixel electrode in the prior art is adopted for the exposure of the coated photoresist in the specific embodiments of the present invention. The procedure of coating, exposing and developing a photoresist in the specific embodiments of the present invention is the same as that in the prior art, which will not be described herein for simplicity.

Figure 7D:
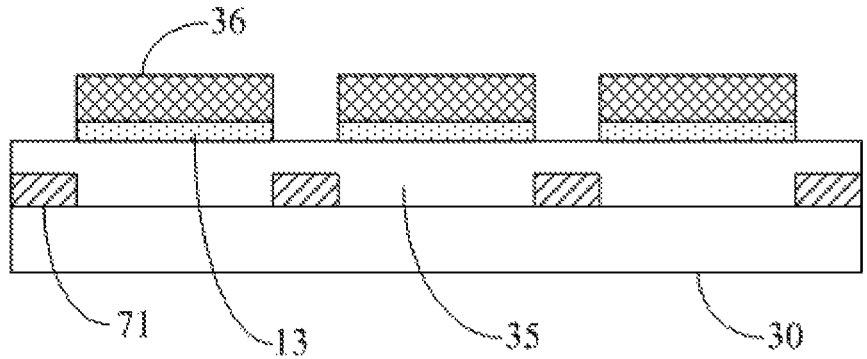

As shown in FIG. 7d, next, by using the patterned photoresist 75 as a mask plate, the transparent conductive film 74 and the blue light filtering film 73 are etched, and the remaining photoresist 75 is removed to form a pixel electrode 36 and a blue light filtering layer 13. In the specific embodiments of the present invention, the transparent conductive film is etched by wet etching. The blue light filtering film can be etched either by wet etching or by dry etching. The specific etching method is selected on basis of specific materials of the blue light filtering film so as to remove the transparent conductive film and the blue light filtering film in regions not covered by the photoresist.

In the specific embodiments of the present invention, before the pixel electrode is plated according to a conventional method for manufacturing an array substrate, a blue light filtering film is formed and synchronically exposed, developed and etched together with the pixel electrode by using a mask plate of the pixel electrode, so as to form a blue light filtering layer below the pixel electrode. The specific embodiments of the present invention make quite little modification to the existing process which is stable in the manufacture of a blue light filtering layer, so the mass production stability will not be affected. As compared with the conventional process, the specific embodiments of the present invention only add a film structure in the pixel display region in the manufacture process, which has little influence on other processes of the product and hence will not affect the quality of the product.

Figure 8:
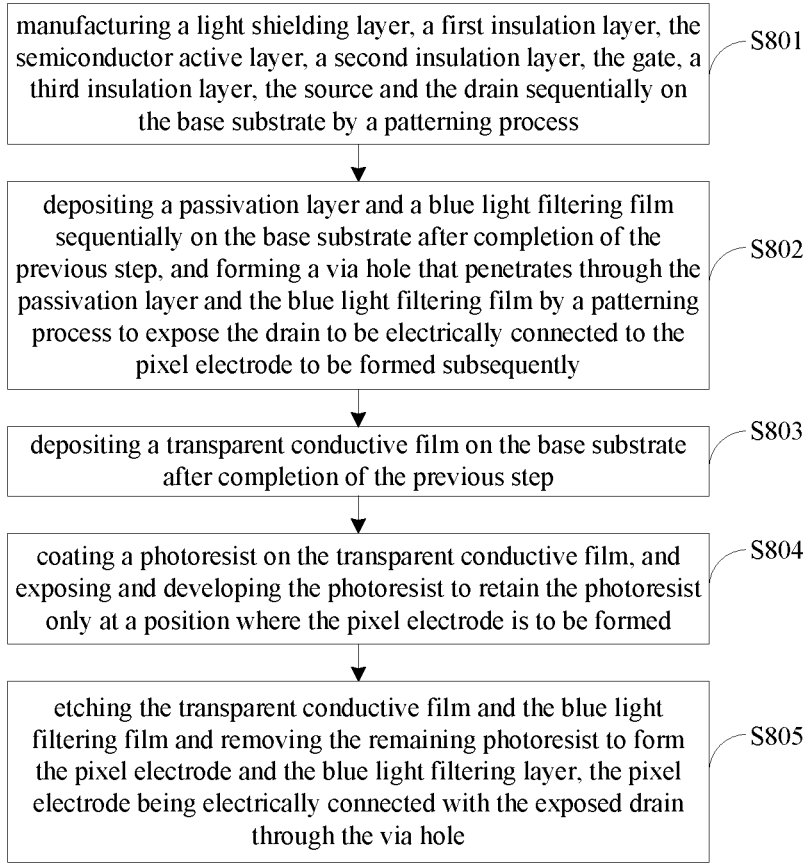
FIG. 8 is a flowchart of a method for manufacturing another array substrate provided in embodiments of the present invention.

For an array substrate with film transistors of a top-gate type, specifically as shown in FIG. 8, the method for manufacturing an array substrate provided in the specific embodiments of the present invention comprises the following steps:

S801, manufacturing a light shielding layer, a first insulation layer, a semiconductor active layer, a second insulation layer, a gate, a third insulation layer, a source and a drain sequentially on a base substrate by a patterning process;

S802, forming a passivation layer and a blue light filtering film sequentially on the base substrate after completion of the previous step, and forming a via hole that penetrates through the passivation layer and the blue light filtering film by a patterning process to expose the drain to be electrically connected to the pixel electrode to be formed subsequently;

S803, forming a transparent conductive film on the base substrate after completion of the previous step;

S804, coating a photoresist on the transparent conductive film, and exposing and developing the photoresist to retain the photoresist only at a position where the pixel electrode is to be formed;

S805, etching the transparent conductive film and the blue light filtering film and removing the remaining photoresist to form the pixel electrode and the blue light filtering layer, the pixel electrode being electrically connected with the exposed drain through the via hole.

The specific method for manufacturing the light shielding layer, the first insulation layer, the semiconductor active layer, the second insulation layer, the gate, the third insulation layer, the source and the drain sequentially on the base substrate by a patterning process is the same as that in the prior art, which will not be described herein for simplicity. For example, the first insulation layer, the second insulation and the third insulation layer in the specific embodiments of the present invention are made of the same material, and are specifically monolayers of silicon dioxide ($SiO_2$), or monolayers of silicon nitride (SiN), or composite films of silicon dioxide and silicon nitride. The passivation layer in the specific embodiments of the present invention can be a monolayer of silicon dioxide, or a monolayer of silicon nitride, or a composite film of silicon dioxide and silicon nitride.

In order to verify that the arrangement of a blue light filtering layer in the specific embodiments of the present invention does not influence qualities of the liquid crystal display screen such as gamut and transmittance, the specific embodiments of the present invention simulates the spectrum of the backlight in coordination with the liquid crystal layer and the color filter substrate before and after filtering by the blue light filtering layer. The simulation results are shown in table 1.

As can be seen from table 1, after filtering by the blue light filtering layer, the gamut of the exit light of the backlight passing through the display panel is not influenced significantly, i.e., the blue light filtering layer does not significantly influence the image quality. In table 1, x and y indicate color coordinates; Gamut (NTSC) is the gamut of NTSC according to Commission Internationale de L'Eclairage (CIE) 1931; Matching Rate is the matching rate under NTSC.

TABLE 1

| | | C.I.E 1931 MDL | | | |
| | | LG-1 (before filtering) | | LG-2 (after filtering) | |
| | | coordinate | | | |
| | d | x | y | x | y |
| White | | 0.298 | 0.290 | 0.329 | 0.353 |
| Red-7200 | 3.0 μm | 0.692 | 0.305 | 0.693 | 0.306 |

TABLE 1-continued

| | | C.I.E 1931 MDL | | | |
| | | LG-1 (before filtering) | | LG-2 (after filtering) | |
| | | coordinate | | | |
| | d | x | y | x | y |
| Green-7200 | 3.0 μm | 0.196 | 0.718 | 0.196 | 0.719 |
| Blue-7200 | 3.0 μm | 0.150 | 0.042 | 0.142 | 0.061 |
| Gamut(NTSC) | | 112.1% | | 110.4% | |
| Matching rate | | 97.51% | | 98.75% | |

To sum up, the specific embodiments of the present invention provide an array of substrate, comprising a light-transmission region and a non-transmission region. The array substrate in the specific embodiments of the present invention comprises a blue light filtering layer located in the light-transmission region, the blue light filtering layer being configured to absorb blue light with a wavelength of smaller than 450 nm. Since the blue light filtering layer in the specific embodiments of the present invention is located in the light-transmission region of the array substrate for absorbing the blue light with a wavelength of smaller than 450 nm, as compared with the prior art in which a complicated film structure for anti-blue light radiation lens is provided, the specific embodiments of the present invention can reduce the amount of harmful blue light in the backlight without influencing the display quality of the product.

Apparently, the skilled person in the art can modify and transform the present invention at will within the range of spirit and principle of the present invention. If the modifications or transformations of the present invention fall within the scope of the claims of the present invention and the equivalent techniques, they are also intended to be included in the present invention.

The invention claimed is:

1. A display panel, comprising an array substrate and a color filter substrate which are arranged oppositely,
wherein the array substrate comprises light-transmission regions and non-transmission regions, each of the light-transmission regions comprises a blue light filtering layer which comprises semiconductor nano particles to absorb blue light with a wavelength smaller than 450 nm, the blue light filtering layer is not arranged in the non-transmission regions, and the semiconductor nano particles are carbon-doped titanium dioxide.

2. The display panel according to claim 1, wherein the array substrate comprises a gate, a gate insulation layer, a semiconductor active layer, a source, a drain, a passivation layer, the blue light filtering layer and a pixel electrode which are arranged sequentially on a base substrate.

3. The display panel according to claim 2, wherein an orthogonal projection of the blue light filtering layer on the base substrate is located within an orthogonal projection of the pixel electrode on the base substrate.

4. A display device, comprising the display panel of claim 1.

* * * * *